(12) United States Patent
Yamaguchi

(10) Patent No.: US 6,653,603 B2
(45) Date of Patent: Nov. 25, 2003

(54) HEATERS

(75) Inventor: Shinji Yamaguchi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/996,443

(22) Filed: Nov. 28, 2001

(65) Prior Publication Data
US 2002/0063120 A1 May 30, 2002

(30) Foreign Application Priority Data
Nov. 30, 2000 (JP) ........................................ 2000-364953

(51) Int. Cl.⁷ ............................. H05B 3/68; C23C 16/00
(52) U.S. Cl. ..................................... 219/444.1; 118/724
(58) Field of Search .......................... 219/443.1, 444.1, 219/462.1, 465.1, 466.1, 467.1, 468.2, 543, 544; 118/724, 725

(56) References Cited
U.S. PATENT DOCUMENTS 2,640,906 A * 6/1953 Haynes .................... 219/466.1
5,059,770 A * 10/1991 Mahawili ................... 219/390
5,294,778 A * 3/1994 Carman et al. ............ 219/385
5,753,891 A * 5/1998 Iwata et al. ................ 219/390
5,766,363 A * 6/1998 Mizuno et al. ............ 118/725
6,035,101 A * 3/2000 Sajoto et al. .............. 118/728
6,133,557 A * 10/2000 Kawanabe et al. ........ 219/544

* cited by examiner

Primary Examiner—Sang Paik
(74) Attorney, Agent, or Firm—Burr & Brown

(57) ABSTRACT

A heater includes a substrate having a placing surface for placing an object to be heated thereon, a layer of a main heating element for heating the substrate and the object to be heated, a layer of an auxiliary heating element, and an insulating body interposed between the main heating element layer and the auxiliary heating element layer. An area of the auxiliary heating element layer is smaller than that of the main heating element layer, and while the substrate and the object to be heated are heated with heat generated from the main heating element layer, heat escaping from the substrate is supplemented with heat generated from the auxiliary heating element layer.

17 Claims, 7 Drawing Sheets

HEATERS

Background of the Invention

(1) Field of the Invention

The present invention relates to heaters for use in semiconductor-producing apparatuses, etc.

(2) Related Art Statement

The semiconductor-producing apparatus is provided with a ceramic heater for heating wafers as substrates in forming thin semiconductive films with a raw gas such as silane gas by hot CVD.

A heater structure so-called a two-zone heater is known as the ceramic heater. In the two-zone heater, an inner resistance heat generator and an outer resistance heat generator made of a high melting point metal such as molybdenum are buried in a ceramic substrate, separate current-introducing terminals are connected to the resistance heat generators, respectively, and given voltages are applied to them, respectively, to independently control the inner and outer resistance heat generators.

Further, in JP-A 5-326112, a resistance heat generator of a ceramic heater is constituted by plural circuit patterns made of a high melting point metal, and the circuit patterns are so arranged that they may supplement one another's defect portions. More specifically, one of the plural circuit patterns is overlapped with the other at a folded portion, a returning portion or the like of the other.

Particularly, when the heater is to be used for heating semiconductor wafers, the temperature of a heating surface of the heater needs to be entirely uniformly controlled. It is required that the heater satisfy a severe requirement that the temperature is within variations of ±5° C. over the whole heating surface under a use condition, for example. The ceramic heater of the two-zone controlling system can ordinarily satisfy such a requirement. However, as a result of making further investigations, the inventors found it difficult to maintain a given uniformly heating characteristic particularly as the temperature rises. For example, in even a ceramic heater which maintains uniformity in the temperature at a heating surface over a temperature range of room temperature to 500° C., for example, variations in temperature at the heating surface sometimes rapidly become greater at its heating surface when the temperature is in a range of 600° C. or higher.

The present inventors advanced investigations on the possible limit in controlling such uniform heating. For example, as shown in FIG. 6, a heater 3A is housed in a chamber 1. The heater 3A includes a planar substrate 5 and a layer of a heating element, 7, for heating the substrate 5. An object 2 to be heated is placed on a placing surface 5a of the substrate 5. The heating element layer 7 contacts a back surface 5b of the substrate 5. The heating element layer 7 is sandwiched between the substrate 5 and the insulating plate 6, and the substrate 5 and an insulating plate 6 are tightened with bolts 8A. A reference numeral 6a denotes a contact surface of the heating element layer. A cylindrical supporting member 10 is integrally joined to a rear surface 6b of the insulating plate 6. A base seat 11 is fixed to a lower end portion of the supporting member 10, and the base seat 11 is fixed to an outer wall (not shown) of the chamber. Reference numerals 4 and 9 denote a gate valve and an electrode cable, respectively.

However, since the diameter of the supporting member 10 is very large, although slightly smaller than that of the insulating plate 6, the area of the supporting member 10 is large. The dimensions of the outer configuration of the supporting member 10 is far larger than those of the entire configuration of the insulating plate 5, the heating element layer 7 and the substrate. As a result, the whole volume of the heater 3A becomes very large, so that much heat transmitted to the supporting member 10 from the substrate 5 constantly escapes. In this state, as the temperature of the substrate 5 rises, cold spots are likely to occur in the substrate 5 due to slight non-uniformity, etc. in producing the constituting members, thereby deteriorating uniformly heating ability. Further, since the gate valve 4 is arranged near the peripheral portion 5C of the substrate 5, heat escapes from near the gate valve 4 at the peripheral portion 5c of the substrate 5, resulting in a cold spot.

In order to solve the problems that the supporting member 10 has a large volume and that heat escapes from the supporting member 10 non-uniformly, the present inventors contrived and examined a heater 3B as schematically shown in FIG. 7. In the heater 3B, an additional insulating plate 14 is laminated on a side of a rear side 6b of an insulating plate 6, and is tightened with bolts 8B. A cylindrical supporting member 13 is provided under the insulating plate 14, and fixed to a base seat 11. The base seat 11 is attached to an outer wall (not shown) of a chamber. In this heater, since the insulating plate 6, a heating element layer 7 and a substrate 5 are attached to the seat of the chamber 11 with the small-sized supporting member 13, the volume of the entire heater 3B can be reduced. However, in this heater, heat escapes from the heating element layer 7 to the insulating plate 14 and the supporting member 13 as shown by an arrow A, a cold spot still occurs when the placing surface of the substrate becomes high temperatures.

SUMMARY OF THE INVENTION

It is an object of the present invention to provide a heater for heating on a substrate an object to be heated, having a structure which effectively prevents cold spots at a placing surface of the substrate and thereby enhances uniformity in temperature of the placing surface.

It is another object of the present invention to reduce the entire volume of the heater, while maintaining uniformity of the temperature of the placing surface of the substrate.

The heater according to the present invention includes a substrate having a placing surface for placing an object to be heated thereon, a layer of a main heating element for heating the substrate and the object, a layer of an auxiliary heating element, and an insulating body interposed between the main heating element layer and the auxiliary heating element layer. An area of the auxiliary heating element layer is smaller than that of the main heating element layer, and while the substrate and the object are heated with heat generated from the main heating element layer, heat escaping from the substrate is supplemented with heat generated from the auxiliary heating element layer.

These and other features of the invention will be appreciated upon reading the following description of the invention when taken in connection with the attached drawings, with the understanding that some modifications, variations and changes could be easily made by the skilled person in the art to which the invention pertains.

BRIEF DESCRIPTION OF THE DRAWINGS

For a better understanding of the invention, reference is made to the attached drawings, wherein.

DETAILED DESCRIPTION OF THE INVENTION

The present invention will be explained with reference to the following drawings.

Figure 1:
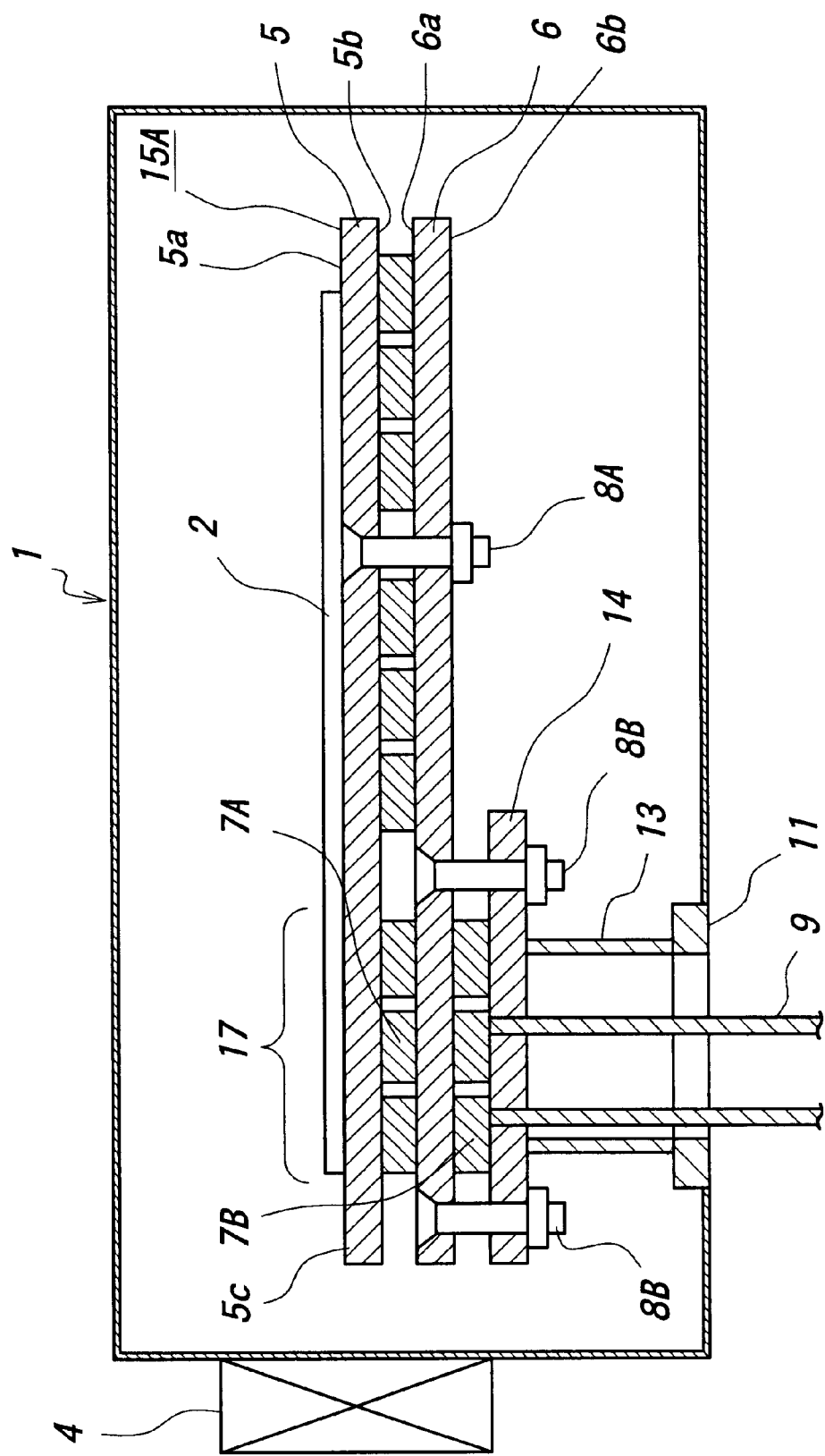
FIG. 1 is a sectional view schematically illustrating a heater 15A according to one embodiment of the present invention.
Figure 2:
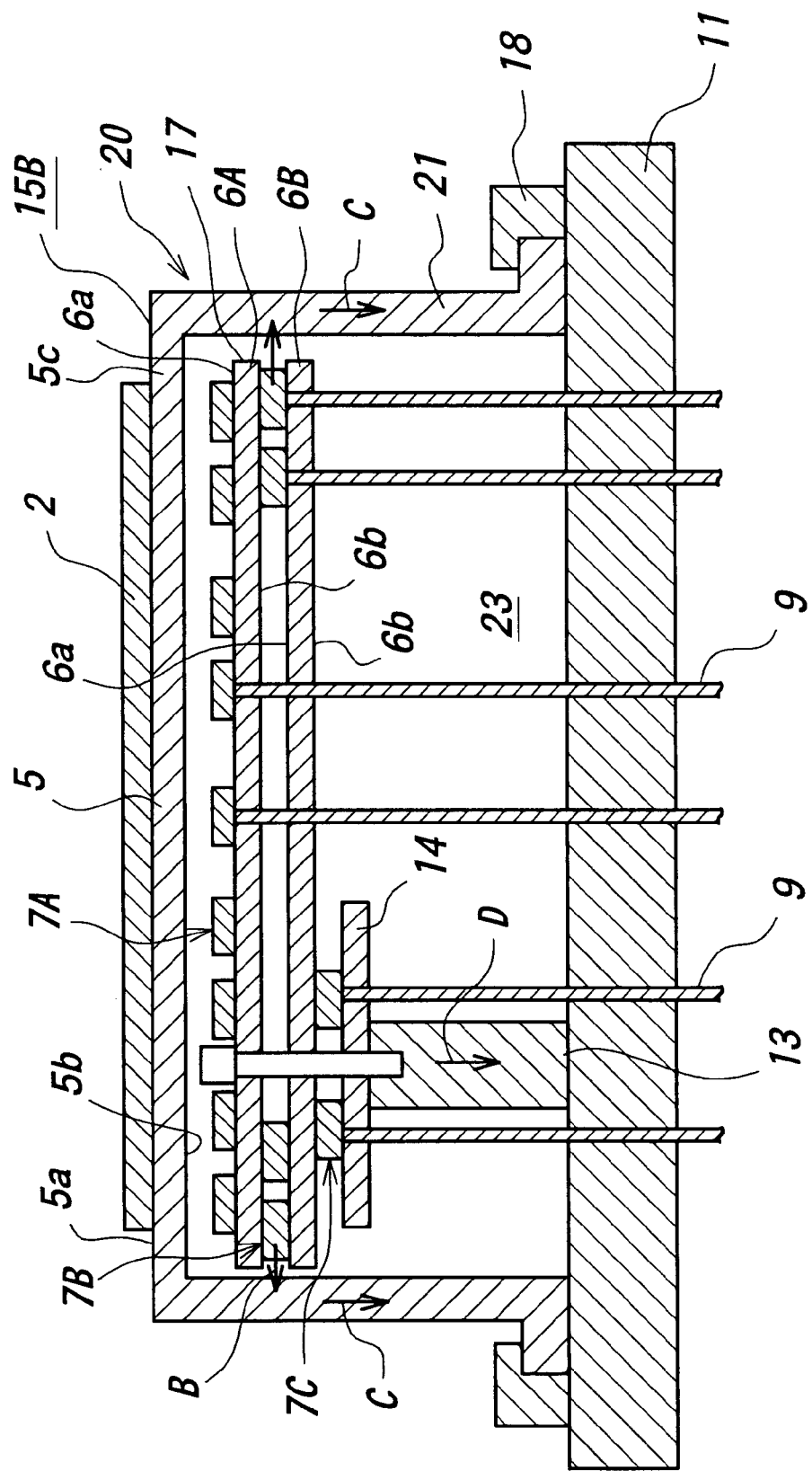
FIG. 2 is a sectional view schematically illustrating a heater 15B according to another embodiment of the present invention.

FIG. 1 is a sectional view schematically illustrating a heater 15A according to one embodiment of the present invention, and FIG. 2 is a sectional view schematically illustrating a heater 15B according to another embodiment of the present invention.

The heater 15A is housed in a chamber 1. The heater 15A includes a planar substrate 5, and a layer of a main heating element, 7A, for heating the substrate 5. An object 2 to be heated is placed on a placing surface 5a of the substrate 5. The heating element layer 7A contacts a rear surface 5b of the substrate 5, and is sandwiched between the substrate 5 and an insulating plate 6. The substrate 5 and the insulating plate 6 are tightened with bolts 8A. A reference numeral 6a denotes a contact surface of the insulating plate to the heating element layer 7A. A layer of an auxiliary heating element 7B is contacted with a rear surface 6b of the insulating plate 6. The auxiliary heating element layer 7B is sandwiched between insulating plates 6 and 14, and the insulating plates 6 and 14 are tightened with bolts 8B. The insulating plate 14 is attached to a supporting member 13. A supporting member 13 is attached to a chamber seat 11.

Since the diameter of the supporting member 13 is far smaller than that of the substrate 5 in the heater 15A of this embodiment, the capacity of the heater is conspicuously smaller than that of the conventional heaters. In this construction, the object 2 and the substrate 5 are heated mainly with the main heating element layer 7A. Therefore, the main heating element layer 7A has an area identical with or larger than that of the object 2 to be heated. When the placing surface 5a is kept at a high temperature, heat escapes through the supporting member 13 to the chamber so that cold spots might occur in an area 17 of the placing surface 5a. However, according to the present invention, since the auxiliary heating element layer 7B, which has a smaller area and a smaller diameter as compared with the main heating element layer 7A, is provided between the supporting member 13 and the main heating element layer 7A, the auxiliary heating element layer 7B can be appropriately adopted to generate heat, thereby suppressing or eliminating the cold spots.

Further, heat may escape from a peripheral portion 5c of the substrate 5 near the gate value 4 toward the gate value, so that a cold spot possibly occurs near the peripheral portion 5c. However, such a cold spot can be suppressed or eliminated by appropriately making the auxiliary heating element layer 7B generate heat.

In the present invention, the main heating element is a layer of a heating element functioning to heat mainly the object to be heated. The main heating element layer may contact directly the rear surface of the substrate. Alternatively, an additional material, preferably an insulating body may be interposed between the rear surface of the substrate and the main heating element layer. Further, the main heating element layer may be buried in the substrate.

The substrate may be a monolithic body, but it may be constituted by plural layers of insulating plates. Further, the invention includes a case where an additional member is interposed between the placing surface of the substrate and the object to be heated.

The auxiliary heating element layer may be laminated adjacent to or away from the main heating element layer. Further, when two or more auxiliary heating element layers are provided, heat can be prevented from escaping from their corresponding portions of the heater, respectively.

In the heater 15B, which is shown in FIG. 2, a space 23 is defined by arranging a lid 20 on a base seat 11. The lid 20 comprises an almost discoid substrate 5, and a cylindrical wall portion 21 projecting downwardly from a peripheral portion 5c of the substrate 5 in this figure. A lower end of the wall portion 21 is fixed to the base seat 11 with a fixing member 18.

A heating element and an insulating body are housed inside the lid 20. That is, a supporting member 13 is fixed on the base seat 11, and an auxiliary heating element layer 7C is supported on the supporting member 13 via an insulating plate 14. An insulating plate 6B, an auxiliary heating element layer 7B, an insulating plate 6A and a main heating element layer 7A are successively laminated and supported on the heating element layer 7C. The main heating element layer 7A is opposed to the substrate 5, and a slight gap is present between them. An object 2 to be heated is placed and supported on the substrate 5.

Figure 3A:
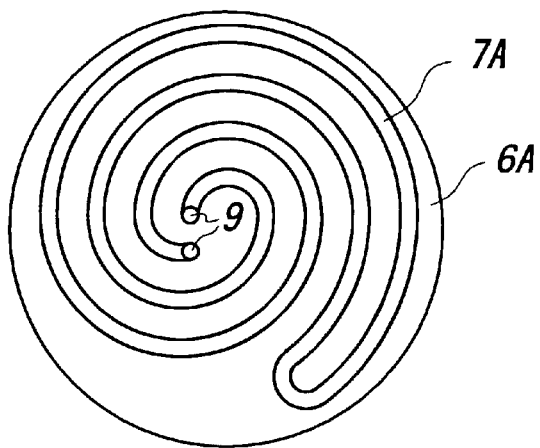
FIGS. 3(a), (b) and (c) are views illustrating planar patterns of heating element layers 7A, 7B, and 7C, respectively.
Figure 3B:
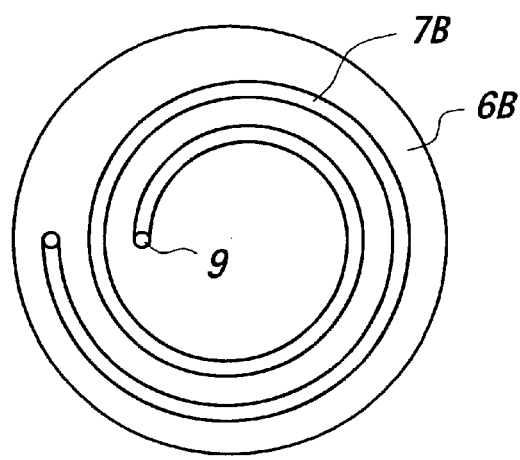

In this embodiment, the main heating element layer 7A is widely provided over an area almost identical with that of the object 2 as shown in FIG. 3(a), for example. To the contrary, the auxiliary heating element layer 7B is provided corresponding to only peripheral portions of the insulating plates 6A, 6B and the substrate 5, respectively, as shown in FIG. 3(b), for example. Thereby, the heating element layer 7B constitutes an outer peripheral heater, so that it can supplement heat escaping through the wall portion 21 from the peripheral portion of the substrate 5 as in arrows B and C. For this purpose, the auxiliary heating element layer 7B is provided corresponding to only the peripheral portions of the insulating plates 6A, 6B and the substrate 5, respectively, not in central portions thereof. Therefore, the outer shape of the auxiliary heating element layer 7B is identical with or slightly greater than that of the main heating element layer 7A, but the area of the main heating element layer 7A is far greater than that of the auxiliary heating element layer 7B.

Figure 3C:
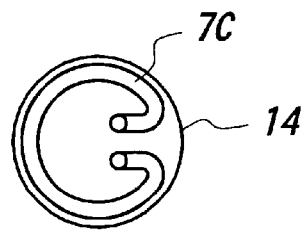

Further, the auxiliary heating element layer 7C is sandwiched between the insulating plate 6B and the insulating plate 14, so that the heating element layer 7C supplements heat escaping through the supporting member 13 as in the heater of FIG. 1. The auxiliary heating element layer 7C has a planar shape, for example, as shown in FIG. 3(c).

The heater according to the present invention may be an integral one. The term "integral" means that at least the main heating element layer, the substrate and the auxiliary heating element layer are integrated. In other words, the main heating element layer and the auxiliary heating element layer are buried in a base material. The base material is preferably made of a ceramic material, and more preferably an integrally sintered body. When the heater of such an integral type is used, the heater has a easy handling merit in addition to the above functions and effects. Further, as compared with the embodiments in which the members are separated, the heating and cooling rates of the heater are large, so that its response time is short (heating and cooling rates of not less than 50° C./min. attainable, for example).

Figure 4:
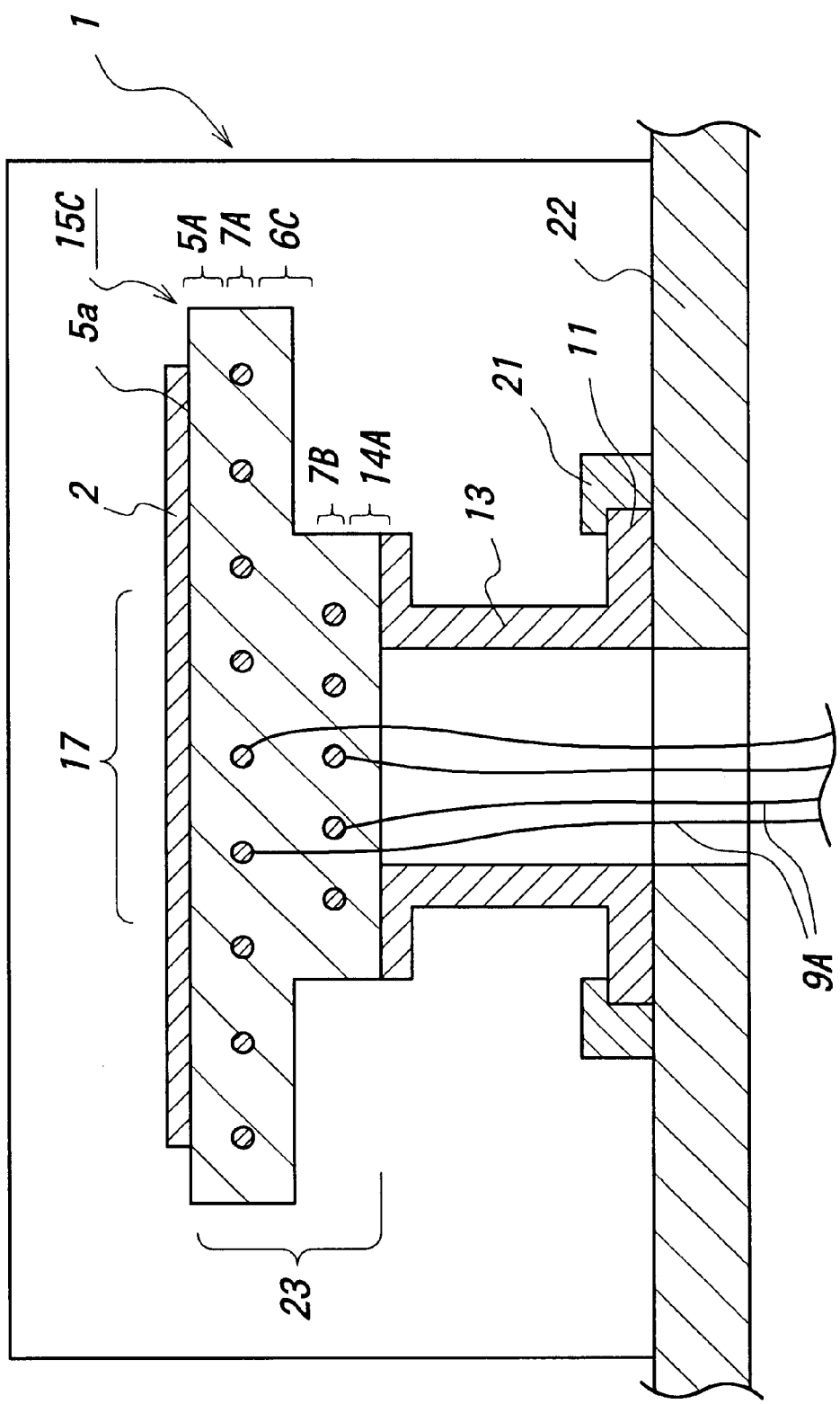
FIG. 4 is a sectional view schematically illustrating a heater 15C according to a further embodiment of the present invention.

FIG. 4 is a sectional view of schematically showing a heater 15C according to such an embodiment of the present invention. A main heating element layer 7A and an auxiliary heating element layer 7B are buried in an integral base material, such as a ceramic sintered body 23. The heating element layers operate in the same manner as in the above-mentioned heaters. In FIG. 4, a substrate 5A is provided between the main heating element layer 7A and a placing surface 5a, an insulating layer 6C is between the main heating element layer 7A and the auxiliary heating element layer 7B, and a smallsized insulating layer 14A is between the auxiliary heating element layer 7B and the supporting layer 13. Reference numerals 11, 21, 22 and 9A denote a base seat, a fixing member, an outer wall of a chamber and an electrode cable, respectively.

Figure 5:
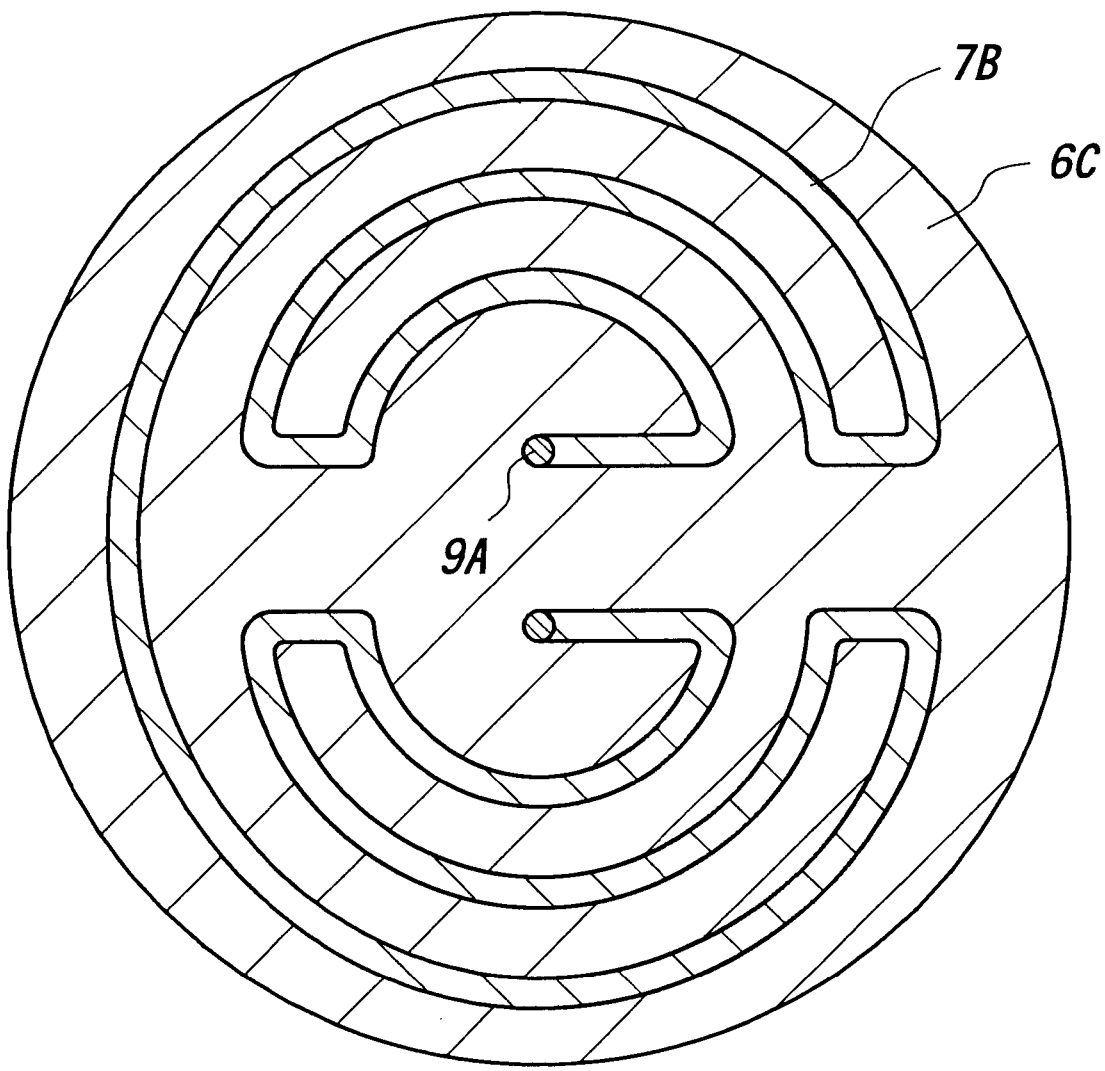
FIG. 5 is a sectional view of a planar pattern of a heating element layer 7B in the heater of FIG. 4.
Figure 6:
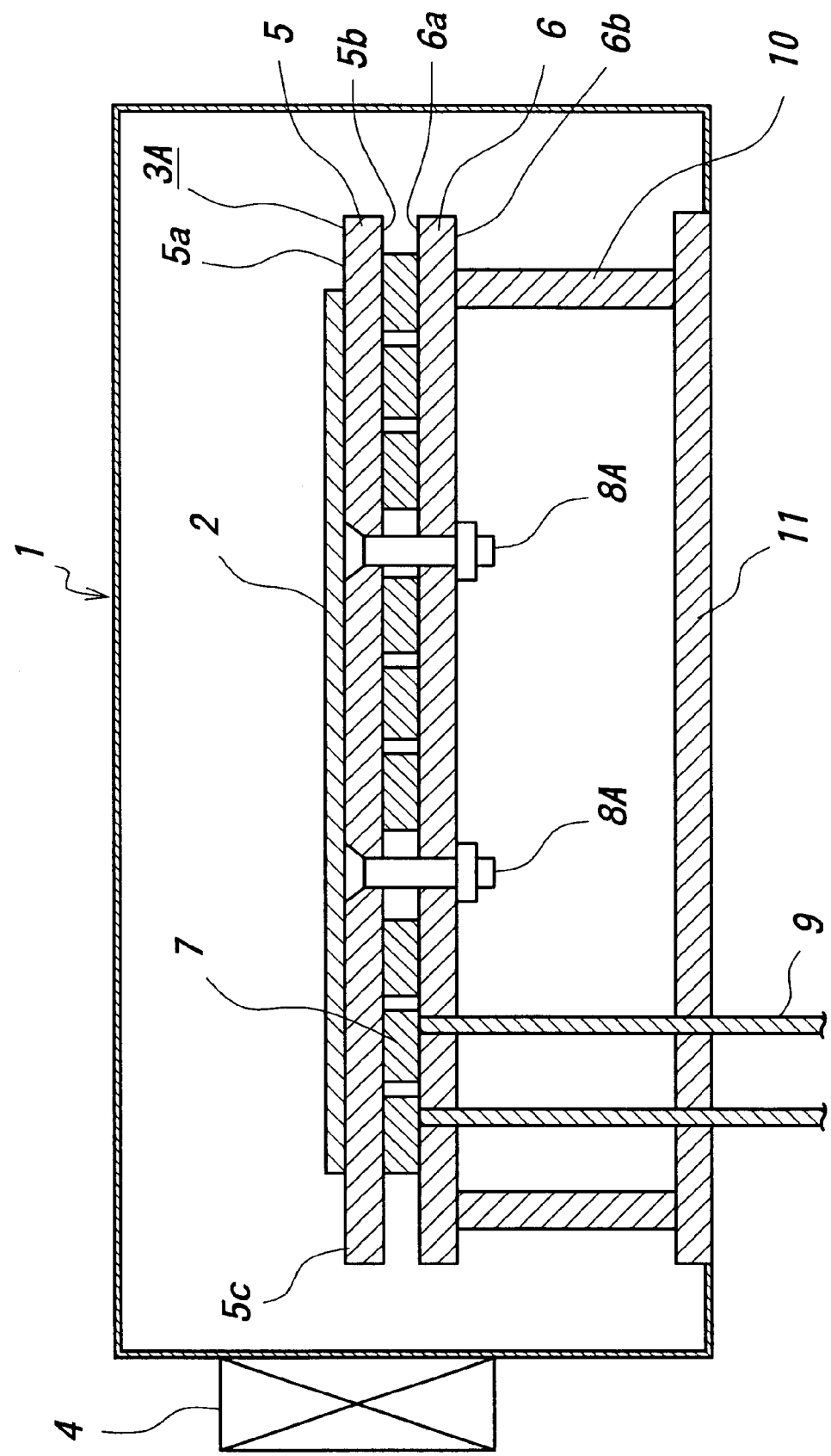
FIG. 6 is a sectional view schematically illustrating a heater 3A outside the scope of the present invention.
Figure 7:
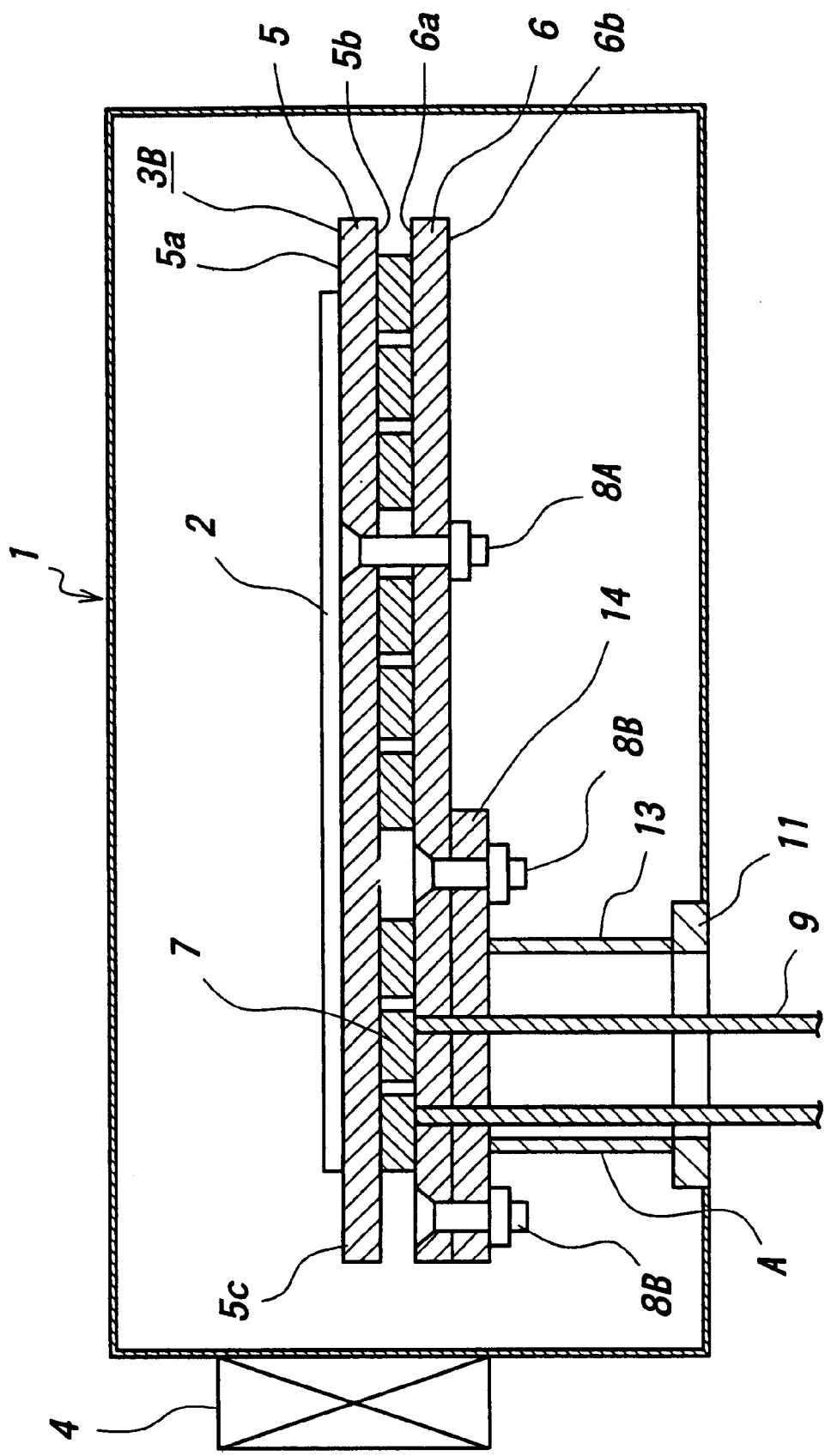
FIG. 7 is a sectional view schematically illustrating a heater 3B outside the scope of the present invention which the inventors contrived.

The planar pattern of the main heating element layer 7A may be a pattern as shown in FIG. 3(a), for example. The auxiliary heating element layer 7B may have a planar pattern as shown in FIG. 5, for example.

The ratio in area between the main heating element layer and the auxiliary heating element layer is not particularly limited, since the ratio should be appropriately set from the standpoint of supplementing heat. The ratio is ordinarily not more than 0.7 times, and preferably 1:2. In order to effectively supplement heat, the ratio is preferably not less than 1:20.

Each of the main heating element layer and the auxiliary heating element layer is not limited to a specific material, and may be made of a metal, a conductive ceramic material or the like. As to a specific material, tantalum, tungsten, molybdenum, platinum, rhenium, hafnium or a high melting point metal alloy of any of them is preferably used. Particularly, if the substrate is made of aluminum nitride, the heating element layers are preferably made of molybdenum or its alloy. Further, an electrically conductive material such as carbon, TiN or TiC may be used besides the high melting point metals.

The microscopic configuration of each of the main heating element layer and the auxiliary heating element layer is not particularly limited so long as the object of the present invention can be realized. For example, the heating element layer may be constituted by a net, a coil spring, a planar member, a ribbon or the like. Further, the planar pattern of each of the main heating element layer and the auxiliary heating element layer is not particularly limited.

The kind of each of the insulating plate and the substrate is not limited, but it is preferably a ceramic material from the standpoint of preventing contamination. Aluminum nitride, silicon nitride, boron nitride and carbon nitride are particularly preferred.

The placing surface of the substrate, the main heating element layer and the auxiliary heating element layer are preferably almost in parallel to one another. In this case, heat can be extremely uniformly conducted in the heater in the vertical directions. Therefore, if the object to be heated, such as a semiconductor wafer is placed on the placing surface 5a of the substrate, the wafer can be uniformly and effectively heated. The wording "almost in parallel to one another" here includes a case where the members are geometrically completely in parallel to one another and a case where their parallel degrees are within 0 to 3 degrees.

The planar outer shape of the main heating element layer may be almost similar to that of the auxiliary heating element layer as viewed in plane. Alternatively, both of their outer shapes may be of an almost circular shape or an almost elliptical shape. The auxiliary heating element layer is preferably annular from the standpoint of supplementing heat escaping from the peripheral portion of the substrate.

The term "heat escaping" in this invention means that heat moves from the placing surface and the substrate at high temperatures to other portions at low temperatures of the heater. Such other portion sat the lower temperatures may be the supporting member, the gate value, the wall portion, other constituent members inside the chamber and/or a gas-introducing portion.

In order to effectively attain the functions and effects of the present invention, the average temperature of the placing surface is preferably not less than 450° C., and more preferably not less than 600° C.

If a small-sized supporting member 13 is used, the ratio in area (area parallel to the substrate) of the supporting member 13 to the substrate 5 is preferably 1:3 or less, and more preferably 1:10 or less, and preferably 1:200 or more from the standpoint of effectively supplementing heat.

As having been described in the above, the present invention can provide the heater for heating the object to be heated on the substrate with a structure that the cold spot at the placing plate at the upper side of the substrate can be effectively prevented to enhance uniformity of the temperature at the placing surface.

What is claimed is:

1. A heater comprising a substrate having a placing surface for placing an object to be heated thereon, a main heating element layer for heating the substrate and the object to be heated, an auxiliary heating element layer, and an insulating body interposed between the main heating element layer and the auxiliary heating element layer, wherein an area of the auxiliary heating element layer is smaller than an area of the main heating element layer, and while the substrate and the object to be heated are heated with heat generated from the main heating element layer, heat escaping from the substrate is supplemented with heat generated from the auxiliary heating element layer.

2. The heater set forth in claim 1, wherein the insulating body is an insulating plate.

3. The heater set forth in claim 1, which further comprises a supporting member for supporting the substrate, the main heating element layer, the auxiliary heating element layer and the insulating body and wherein heat escaping from the supporting member is supplemented with heat generated from the auxiliary heating element layer.

4. The heater set forth in claim 2, which further comprises a supporting member for supporting the substrate, the main heating element layer, the auxiliary heating element layer and the insulating body and wherein heat escaping from the supporting member is supplemented with heat generated from the auxiliary heating element layer.

5. The heater set forth in claim 3, wherein the auxiliary heating element layer and the insulating body are interposed between the supporting member and the main heating element layer.

6. The heater set forth in claim 4, wherein the auxiliary heating element layer and the insulating body are interposed between the supporting member and the main heating element layer.

7. The heater set forth in claim 1, wherein the auxiliary heating element layer is arranged at a peripheral portion of the substrate as viewed in a plane of the heater, and heat escaping from the peripheral portion of the substrate is supplemented with heat generated from the auxiliary heating element.

8. The heater set forth in claim 2, wherein the auxiliary heating element layer is arranged at a peripheral portion of the substrate as viewed in a plane of the heater, and heat escaping from the peripheral portion of the substrate is supplemented with heat generated from the auxiliary heating element.

9. The heater set forth in claim 4, wherein the auxiliary heating element layer is arranged at a peripheral portion of the substrate as viewed in a plane of the heater, and heat escaping from the peripheral portion of the substrate is supplemented with heat generated from the auxiliary heating element.

10. The heater set forth in claim 5, wherein the auxiliary heating element layer is arranged at a peripheral portion of the substrate as viewed in a plane of the heater, and heat escaping from the peripheral portion of the substrate is supplemented with heat generated from the auxiliary heating element.

11. The heater set forth in claim 6, wherein the auxiliary heating element layer is arranged at a peripheral portion of the substrate as viewed in a plane of the heater, and heat escaping from the peripheral portion of the substrate is supplemented with heat generated from the auxiliary heating element.

12. The heater set forth in claim 7, wherein the auxiliary heating element layer is in an annular shape.

13. The heater set forth in claim 8, wherein the auxiliary heating element layer is in an annular shape.

14. The heater set forth in claim 9, wherein the auxiliary heating element layer is in an annular shape.

15. The heater set forth in claim 10, wherein the auxiliary heating element layer is in an annular shape.

16. The heater set forth in claim 11, wherein the auxiliary heating element layer is in an annular shape.

17. The heater set forth in claim 2, wherein the auxiliary heating element layer comprises at least two layers of auxiliary heating elements, the escape of heat from the supporting element is supplemented with heat generated from one of the at least two auxiliary heating element layers, the other is arranged in a peripheral portion of the substrate and escape of heat from the peripheral portion of the substrate is supplemented with heat generated from the said other auxiliary heating element(s).

* * * * *